United States Patent [19]

Ito

[11] Patent Number: 5,611,698

[45] Date of Patent: Mar. 18, 1997

[54] SURFACE MOUNTING IC SOCKET

[75] Inventor: Toshiyasu Ito, Togane, Japan

[73] Assignee: Yamaichi Electronics Co., Ltd., Tokyo, Japan

[21] Appl. No.: 301,008

[22] Filed: Sep. 6, 1994

[30] Foreign Application Priority Data

Sep. 6, 1993 [JP] Japan .................................. 5-245913

[51] Int. Cl.$^6$ .................................................. H01R 9/09
[52] U.S. Cl. ............................ 439/72; 439/71; 439/331
[58] Field of Search ........................... 439/68, 66, 70, 439/72, 330, 331, 525, 526

[56] References Cited

U.S. PATENT DOCUMENTS

| 4,934,944 | 6/1990 | Kozel et al. | 439/68 |
| 4,936,784 | 6/1990 | Saito | 439/72 |
| 4,941,832 | 7/1990 | Korsunsky et al. | 439/72 |
| 4,984,991 | 1/1991 | Nishimoto | 439/72 |

*Primary Examiner*—Hien D. Vu
*Attorney, Agent, or Firm*—Wenderoth, Lind & Ponack

[57] ABSTRACT

A surface mounting IC socket includes an IC receiving section defined in a frame, and a plurality of contacts spaced apart in side-by-side relation along the frame. Leads of an IC received in the IC receiving section are brought into electrical connection with the contacts within the IC receiving section. Each contact includes a press-in plate portion which is to be pressed into the frame from a lower surface of the frame adapted to confront a wiring board, a contacting arm to be contacted with one of the IC leads extending toward the IC receiving section from a lower end of the press-in plate portion, and a surface mounting arm extending from a lower end of the press-in plate portion toward the IC receiving portion so as to be soldered to a pattern formed on the wiring board.

10 Claims, 3 Drawing Sheets

SURFACE MOUNTING IC SOCKET

BACKGROUND OF THE INVENTION

1. Field of the Invention

This invention relates to a surface mounting IC socket including a means for overlying-and-contacting leads of an IC and a means for soldering to a wiring pattern formed on a wiring board.

2. Description of Related Art

U.S. Pat. No. 4,934,944 discloses a typical example of a surface mounting IC socket of this type, in which a plurality of contacts are arranged in side-by-side relation in a socket frame. Each contact includes a press-in portion, an arm for engaging a lead of an IC extending from an upper end of the press-in portion, and a surface mounting arm to be soldered to a wiring pattern formed on a wiring board extending from a lower end of the press-in portion.

In other words, a press-in portion exists between the upper and lower arms, and the side surfaces are arranged in side-by-side relation in opposite relation as mentioned above.

In the above IC socket, since the contacting arm and the surface mounting arm extend from the upper and lower ends of the press-in portion, there is a fear that when the press-in portion is pressed in from a lower or upper surface of the socket, the arms will be deformed by hitting a wall of the frame which defines a press-in-groove. Also, this conventional IC socket is beset by the problems that the press-in operation is not very easy, and faulty press-in work occurs.

In the socket of the above construction, since the surfaces of the press-in portion of the contacts exist in side-by-side relation, there is a limit in reducing the arrangement pitch between adjacent contacts. Similarly, since the surfaces of the contacting arm and the surface mounting arm, which extend respectively from the upper and lower ends of the press-in portion, exist in the side-by-side arrangement direction, the contacts arrangement cannot correctly correspond to the IC leads having a very small pitch arrangement.

Also, since the socket is of a press-in structure, it is difficult to ensure a sufficient degree of press-in strength of the press-in portion against loads applied to the arms.

SUMMARY OF THE INVENTION

It is therefore an object of the present invention to provide a surface mounting IC socket in which contacts can be arranged at very small pitches without sacrificing the press-in strength.

Another object of the present invention is to provide a surface mounting IC socket in which a smooth press-in operation is ensured.

In order to achieve the above objects, there is provided a surface mounting IC socket comprising an IC receiving section defined in a frame, and a plurality of contacts spaced apart in side-by-side relation in the frame, leads of an IC received in the IC receiving section being brought into electrical connection with the contacts within the IC receiving section. Each contact includes a press-in plate portion formed on an uppermost end thereof and adapted to be pressed into the frame from a lower surface of the frame adapted to confront a wiring board, a contacting arm to be contacted with one of the IC leads extending toward the IC receiving section from a lower end of the press-in plate portion, and a surface mounting arm extending from a lower end of the press-in plate portion toward the IC receiving portion to be soldered to a pattern formed on the wiring board.

Preferably, the contacts are arranged in side-by-side relation so that the contacts are located opposite to each other on plate surfaces side of the punched-out plate.

In the above-mentioned surface mounting connector, by pressing the press-in plate portion formed on the uppermost end thereof into a slot of a frame from a lower surface of the frame, the contacting arm and the surface mounting arm, which are in side-by-side relation, can be arranged in predetermined positions from a lower end of the press-in plate portion. Accordingly, the arms can effectively be prevented from being deformed when the contact is pressed in. In addition, the contacts as one group can easily be pressed into the frame and faulty press-in operation can effectively be prevented.

Furthermore, since the side-by-side arrangement pitch of the contacts can be set in accordance with the thickness of each contact, this contact arrangement can properly correspond to the very small pitch arrangement of IC leads. In addition, press-in strength can be increased.

The above and other objects, features and advantages of the present invention and the manner of realizing them will become more apparent, and the invention itself will best be understood from a study of the following description and appended claims with reference to the attached drawings showing one preferred embodiment of the invention.

DETAILED DESCRIPTION OF THE EMBODIMENT

Figure 1:
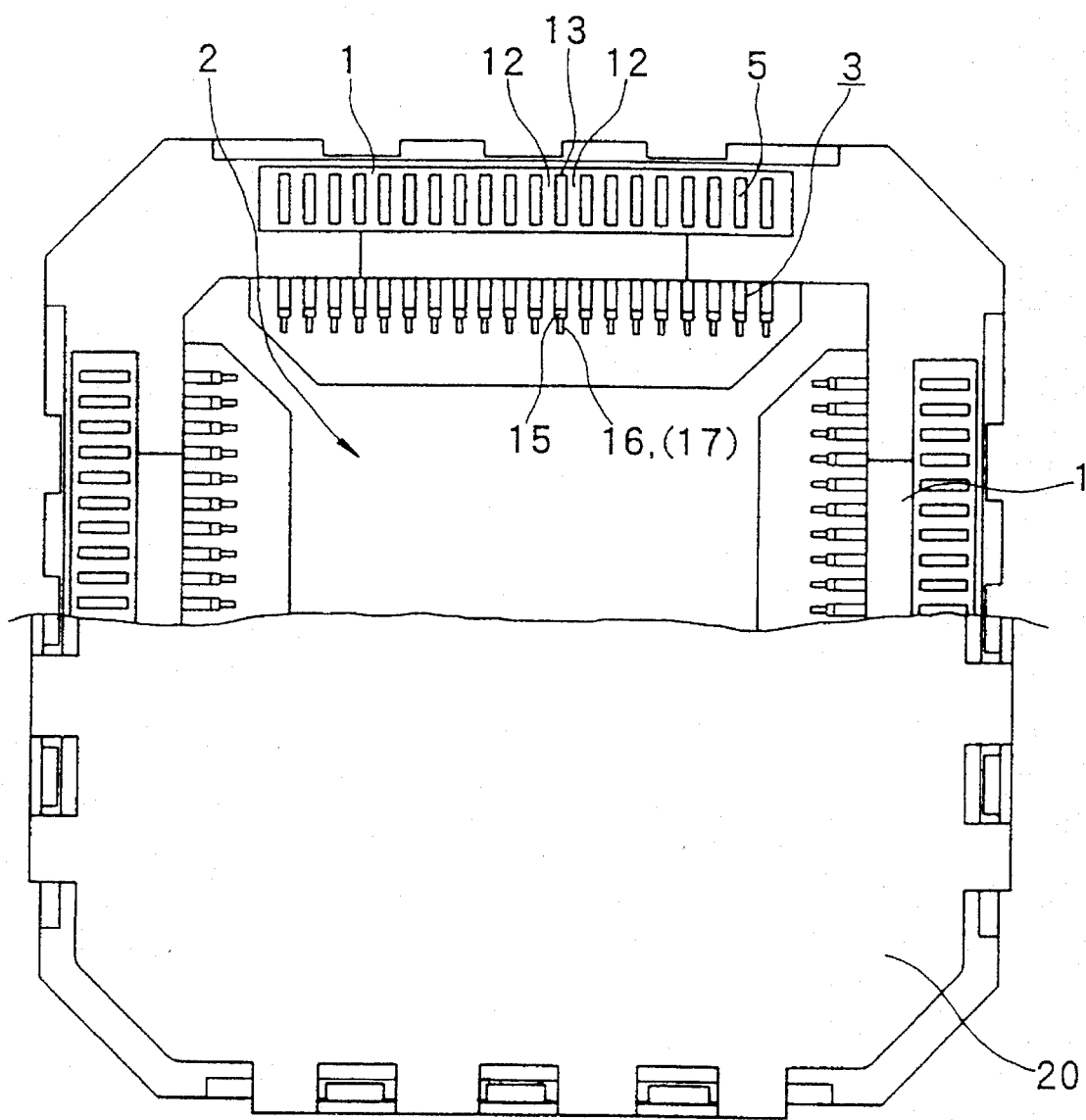
FIG. 1 is a plan view, partly cut-away, of a surface mounting socket according to one embodiment of the present invention.

One embodiment of the present invention will be described hereinafter with reference to the accompanying drawings.

A socket includes an IC receiving section 2 which is defined by a square framework (or frame) 1, and a plurality of contacts 3 which are arranged in side-by-side relation, with equal spacing therebetween, along two or four sides of the framework 1.

Each contact 3 is provided at an uppermost end thereof with a press-in plate portion 5 which is to be pressed into the framework 1 from a lower surface thereof, i.e., a surface which is adapted to confront a wiring board 4, toward an upper surface of the framework 1. The contact 3 is further provided with a contacting arm 8 which extends from a lower end of the press-in plate portion 5 toward the IC receiving section 2, so that a lead 7 of an IC 6 can overlie and contact the arm 8, and with a surface mounting arm 11 which extends from a lower end of the press-in plate portion 5 toward the IC receiving section 2 so as to be subjected to soldering with solder 10 to a wiring pattern 9 formed on the wiring board 4.

The contacts 3 are formed by a punched-out plate (i.e., from plate material), and held opposite to each other on a punched-out plate surface 3a of such punched-out plate material or plate.

That is, the contacts 3 are pressed in and arranged in side-by-side relation with equal spacing therebetween in a side-by-side direction so that the thickness-wise (laterally extending) surfaces 3b of the respective contacts 3 are arranged in a plane in a side-by-side arrangement direction (i.e. a lateral direction) of the contacts.

Accordingly, in the arrangement of the contacting arm 8 and the surface mounting arm 11, thickness-wise surfaces thereof are, as in the case with the press-in plate portion 5, spaced apart in a plane in the side-by-side arrangement direction, and the thickness-wise surfaces are subject to contact with the leads 7 of the IC 6 and also to soldering to the wiring pattern 9.

The contacts 3 are isolated from each other along their plate surface sides, respectively, by partition walls 12 integral with the framework 1.

Figure 2:
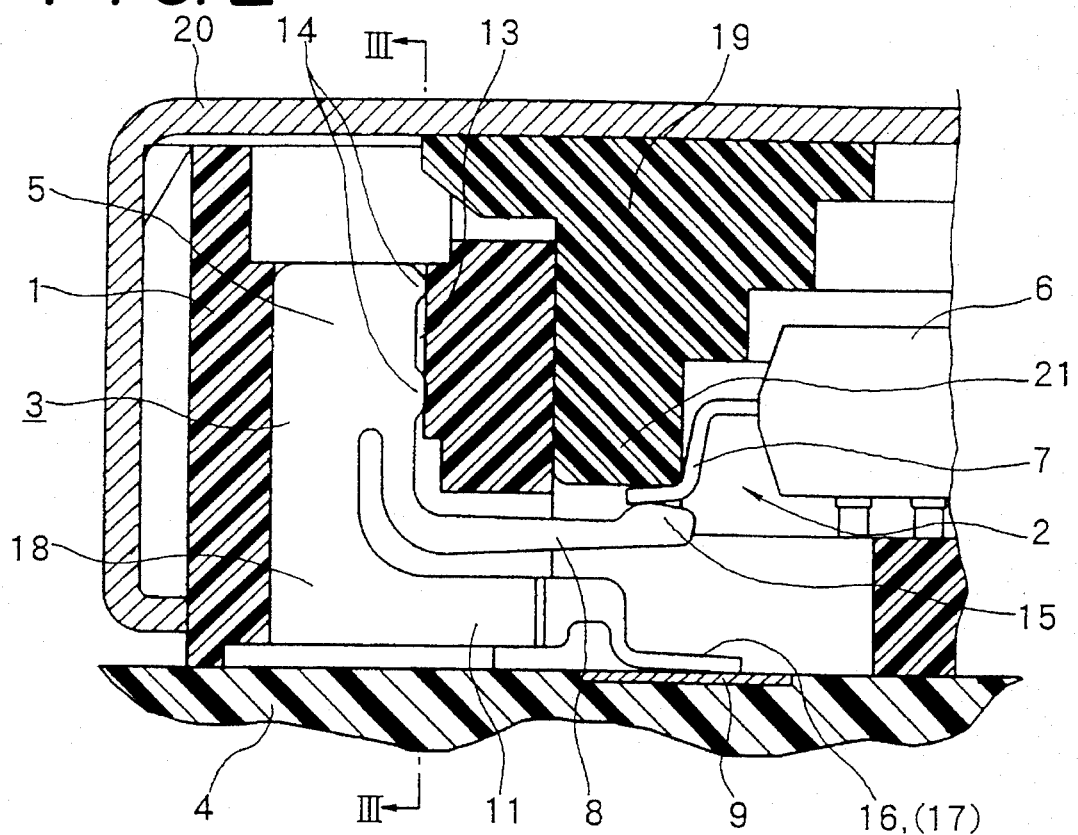
FIG. 2 is a sectional view of an important portion of the above socket with an IC inserted therein.
Figure 3:
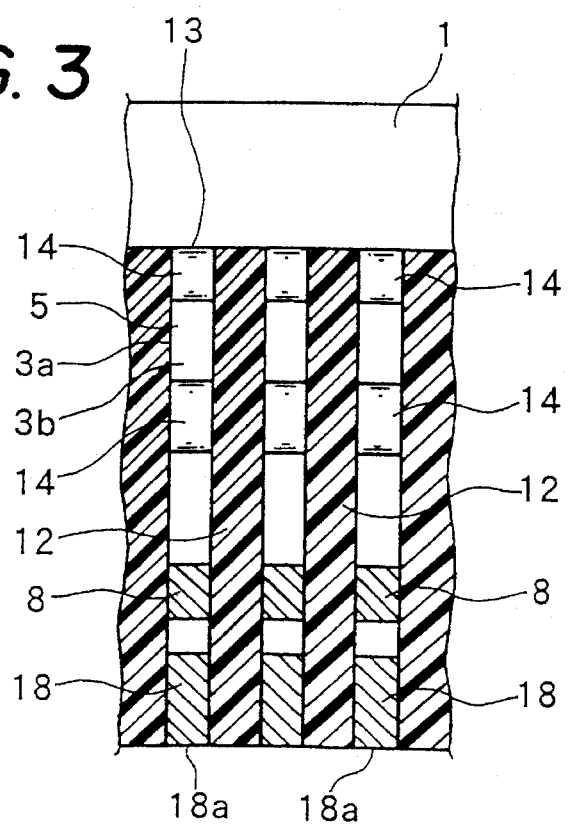
FIG. 3 is a sectional view taken along line III—III of FIG. 2.
Figure 4:
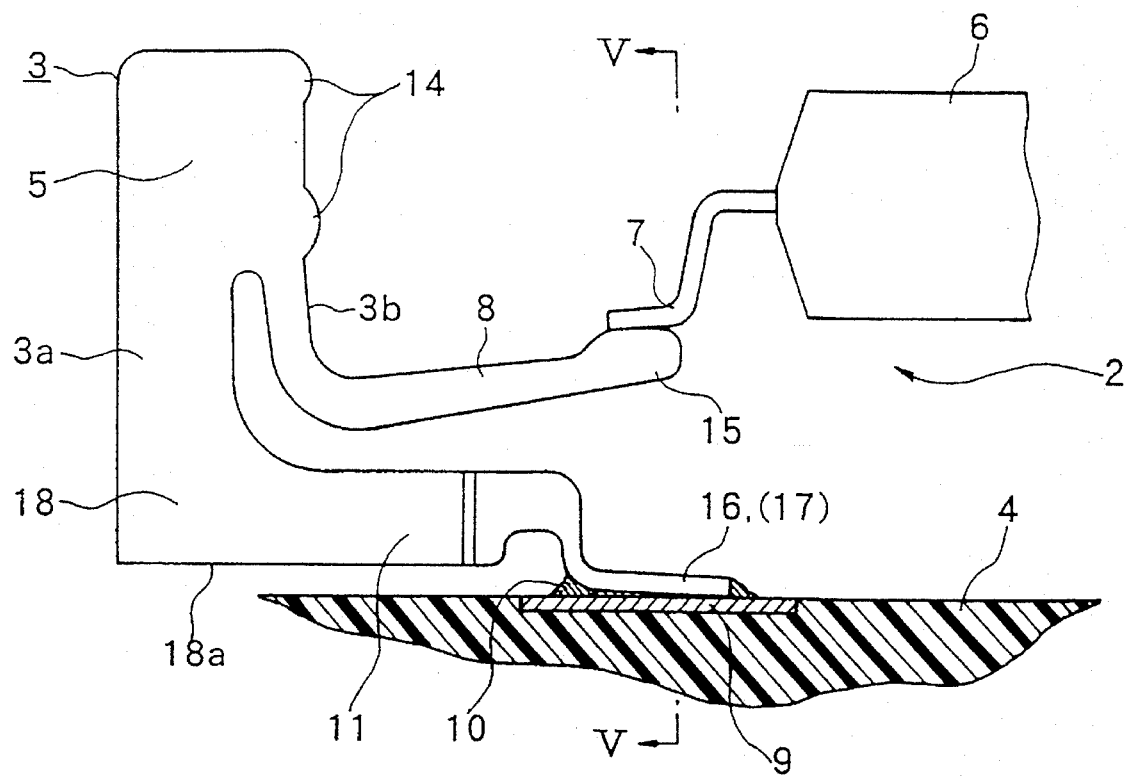
FIG. 4 is a side view of a contact, showing a surface mounting state in the above socket.
Figure 5:
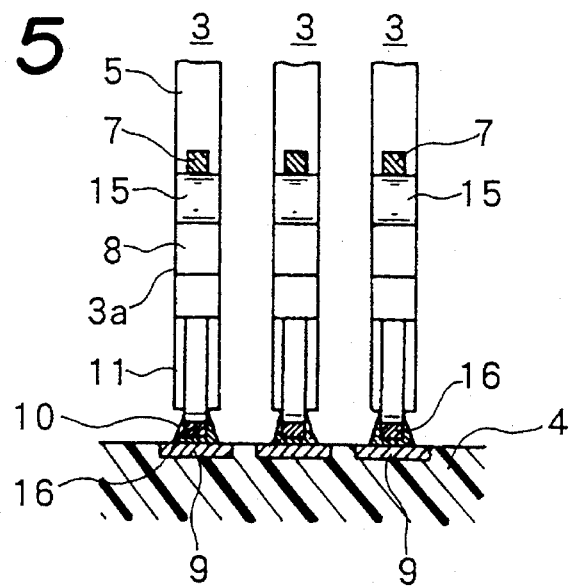
FIG. 5 is a sectional view taken along line V—V of FIG. 4.
Figure 6:
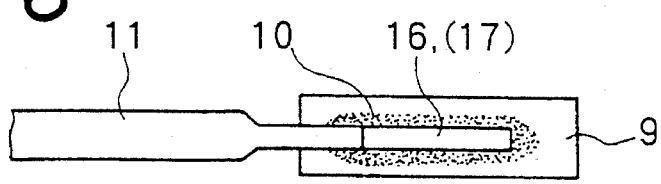
FIG. 6 is a plan view of a surface mounting arm portion of FIG. 4.

Each contact-receiving slot 13, which is formed between adjacent partition walls 12 and which retains the contact 3, is a through-slot which is open at one end thereof to an upper surface of the framework 1 and at the other end thereof to a lower surface of the framework 1. The press-in plate portion 5 is pressed in toward the upper opening of the through-slot 13 from the lower opening, whereby projections 14 formed on a side thickness-wise surface of the press-in plate portion 5 bite into an inner wall of the upper slot portion 13, thereby implanting the contact in the framework 1. That is, as shown in FIG. 2, the press-in plate portion 5 extends in an inward-to-outward direction between a slot inner wall and a slot outer wall.

Both of the contacting arm 8 and the surface mounting arm 11 are connected to the press-in plate portion 5 within the slot 13. Basal portions of the arms 8 and 11 exist within a lower portion of the slot 13, with a distal end portion of the contacting arm 8 projecting into the IC receiving section 2 from the slot 13. An IC lead contacting portion 15 for overlying and contacting the IC lead 7 is formed on the distal end of the contacting arm 8. Similarly, a distal end portion of the surface mounting arm 11 projects into the IC receiving section 2 from the slot 13, and a soldering portion 16, which is to be soldered to the wiring pattern 9 formed on the wiring board 4, is formed on the distal end portion of the surface mounting arm 11.

The IC 6 is received in the IC receiving section 2. Within the IC receiving section 2, the IC lead 7 is placed on the IC lead contacting portion 15 and the soldering portion 16 is soldered by solder 10 to the wiring pattern 9. By this, a surface mounting of the socket to the wiring board 4 is accomplished.

The contacting arm 8 and the IC lead contacting portion 15, as well as the surface mounting arm 11 and the soldered portion 16, are arranged one above the other.

The side surfaces (or plate surfaces) of the arms 8 and 11 exist in the same plane as the plate surface of the press-in plate portion 5. The soldering portion 16 of the surface mounting arm 11 is formed of an elastic piece 17 having a smaller wall thickness than that of the punched-out plate, i.e., than the thickness of the press-in plate portion 5.

This elastic piece 17 is formed by cutting one or both side surfaces of the distal end portion of the arm 11 or flattening the distal end portion of the arm 11 by applying a compressive force to one or both surfaces thereof. By forming the soldering portion 16 from the elastic piece 17 of a reduced wall thickness, the formation of a short circuit with an adjacent soldering portion 16 via a solder bridge can effectively be prevented.

The contact 3 includes an L-shaped press-in force receiving plate portion 18 formed on the end portion of the contact 3 opposite to the press-in plate portion 5.

For example, the basal portion of the surface mounting arm 11 is of a rigid structure, thereby forming the press-in force receiving plate portion 18, and a thickness-wise surface of a lower portion of the press-in force exerting plate portion 18 extends along the lower opening surface of the slot 13 in parallel relation, so as to function as a pressing surface 18a for engagement with a press-in jig. Owing to this arrangement, the press-in plate portion 5 can be smoothly pressed into the slot which is formed in the framework 1 between partitions 12.

Accordingly, the surface mounting arm 11 includes the press-in force receiving plate portion 18 formed on the basal portion of the arm 11 and having rigidity, and the soldering portion 16 formed on the distal end of the arm 11.

Reference numeral 19 denotes a carrier for holding the IC 6. The IC 6 held by the carrier 19 is inserted into the IC receiving section 2. After the IC lead 7 is laid on and contacted with the contacting arm 8, a pressing cover 20 is attached to an upper surface of the framework 1 to press downwardly against an upper surface of the carrier 19. Then, the lead 7 is pressed against the IC lead contacting portion 15 by a pressing pad 21 which is provided on the carrier 19, and the contacting arm 8 is elastically shifted downwardly by this pressing force. By the restoring force of the arm 8, the lead and the arm are brought into a press-in connection relation.

It should be appreciated that the IC 6 can be inserted into the IC receiving section 2 without using the IC carrier 19.

According to the present invention, by pressing the press-in plate portion formed on the uppermost end of the contact into the slot formed in the framework defining the IC receiving section from a lower surface of the framework, the contacting arm and the surface mounting arm, which are in side-by-side relation, can be arranged in predetermined positions from a lowered end of the press-in plate portion. Accordingly, the arms can effectively be prevented from being deformed when the contact is pressed in, and the press-in plate can appropriately be introduced into the slot formed in the press-in plate. In addition, the contacts as one group can easily be pressed into the framework and faulty press-in operation can effectively be prevented.

Furthermore, since the contacts can be arranged in side-by-side relation so that the plate surfaces thereof are in opposite relation, the side-by-side arrangement pitch of the contacts can be set in accordance with the thickness of each contact. Therefore, this contact arrangement can properly correspond to the very small pitch arrangement of the IC leads. In addition, the press-in strength against loads imposed on the arms can be increased extensively.

Although the present invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed by the appended claims and equivalents thereof.

I claim:

1. An IC socket for use in connecting an IC having IC leads to a wiring board having a wiring pattern, said IC socket comprising:

a socket frame having an IC receiving section defined in a center portion thereof, a plurality of vertical contact-receiving slots being formed in said socket frame outwardly of said IC receiving section;

a plurality of contacts respectively mounted in said contact-receiving slots;

wherein each of said contact-receiving slots is elongated in an inward-to-outward direction, which extends from a center of said socket frame toward an outer periphery of said socket frame, so as to extend between a slot inner wall and a slot outer wall wherein said slot outer wall is spaced outwardly of said slot inner wall;

wherein said contacts are spaced apart from one another in side-by-side relation in a side-by-side direction;

wherein each of said contacts includes a press-in portion mounted in an upper portion of a respective one of said contact-receiving slots, a press-in force receiving portion mounted in a lower portion of the respective one of said contact-receiving slots, a contacting arm extending from said press-in portion inwardly toward said IC receiving section and terminating in an IC lead contacting portion, and a surface mounting arm extending from said press-in force receiving portion inwardly toward said IC receiving section and terminating in a soldering portion;

wherein said press-in portion of each of said contacts is constituted by a plate-shaped portion having opposing vertical planar plate surfaces which face in said side-by-side direction such that the vertical planar plate surfaces of adjacent pairs of said press-in portions confront each other in said side-by-side direction;

wherein said press-in portions extend in said inward-to-outward direction between said slot inner walls and said slot outer walls so as to abut against said slot inner walls and said slot outer walls, respectively; and wherein said contacting arm of each of said contacts includes a substantially vertical portion extending downwardly from a respective one of said press-in portions, and a substantially horizontal portion extending from said substantially vertical portion inwardly toward said IC receiving section for directly contacting one of the IC leads.

2. An IC socket as recited in claim 1, wherein said press-in force receiving portion of each of said contacts comprises a plate-shaped portion having opposing vertical planar plate surfaces which face in said side-by-side direction such that the vertical planar plate surfaces of adjacent pairs of said press-in force receiving portions confront each other in said side-by-side direction.

3. An IC socket as recited in claim 2, wherein said press-in force receiving portion of each of said contacts is L-shaped so as to include a vertical leg extending downwardly from a respective one of said press-in portions, and a horizontal portion extending from said vertical leg inwardly toward said IC receiving section.

4. An IC socket as recited in claim 1, wherein said press-in force receiving portion of each of said contacts is L-shaped so as to include a substantially vertical leg extending downwardly from a respective one of said press-in portions, and a substantially horizontal leg extending from said vertical leg inwardly toward said IC receiving section.

5. An IC socket as recited in claim 1, wherein said surface mounting arm of each of said contacts extends substantially horizontally from said press-in force receiving portion toward said IC receiving section, such that said surface mounting arm and said substantially horizontal leg of said contacting arm of each of said contacts are substantially parallel to one another.

6. An IC socket as recited in claim 1, wherein each of said slots has a top end and a bottom end, and said bottom end of each of said slots opens through a bottom surface of said socket frame so as to constitute a contact-insertion opening.

7. An IC socket as recited in claim 1, wherein said socket frame includes partition walls extending between each adjacent pair of said slots.

8. An IC socket as recited in claim 1, wherein each of said contacts is constituted entirely from a punched-out plate.

9. An IC socket as recited in claim 8, wherein wherein said press-in portion, said press-in force-receiving portion, and said contacting arm of each of said contacts are equal in thickness; and said surface mounting arm is thinner than said press-in portion, said press-in force-receiving portion, and said contacting arm for each of said contacts.

10. An IC socket as recited in claim 1, wherein wherein said press-in portion, said press-in force-receiving portion, and said contacting arm of each of said contacts are equal in thickness; and said surface mounting arm is thinner than said press-in portion, said press-in force-receiving portion, and said contacting arm for each of said contacts.

* * * * *